Figure 1:
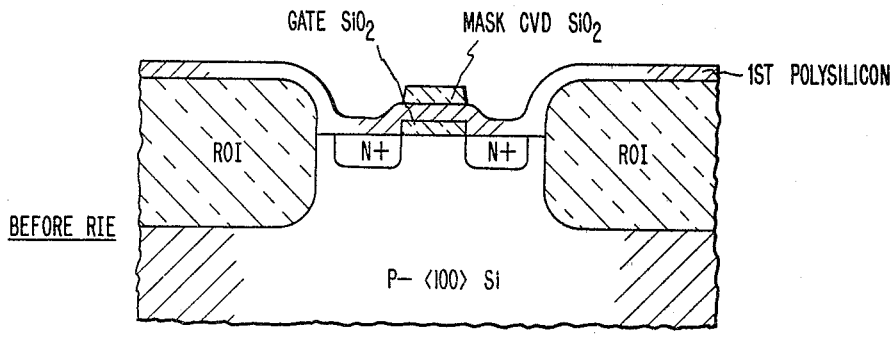
Figure 2:
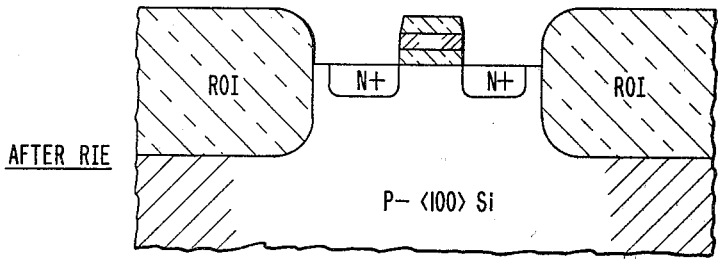

United States Defensive Publication [19] (H) [11] T101,302

Forget et al. [43] Dec. 1, 1981

[54] SELECTIVE REACTIVE ION ETCHING OF POLYCRYSTALLINE SILICON AGAINST MONOCRYSTALLINE SILICON

[76] Inventors: Lawrence E. Forget, Robert Rd., Poughkeepsie, N.Y. 12603; Robert A. Gdula, Campbell Hall Farm, Campbell Hall, N.Y. 10916; Joseph C. Hollis, Beach Rd., Poughquag, N.Y. 12570

[21] Appl. No.: 249,254

[22] Filed: Mar. 30, 1981

Related U.S. Application Data

[63] Continuation of Ser. No. 130,892, Mar. 17, 1980, abandoned.

[51] Int. Cl.[3] ..... H01L 21/308

[52] U.S. Cl. ..... 156/643; 156/646; 156/657; 156/662; 204/192 E; 252/79.1

[57] ABSTRACT

An improved Reactive Ion Etching (RIE) technique for preferentially etching polysilicon is described as is needed in Very Large Scale Integration (VLSI) using silicon technology. The etch gas is a mixture of carbon tetrafluoride ($CF_4$) and chlorine ($Cl_2$) diluted with inert gas. The pressure of the system is required to be in the range of about 10 to 500 milli Torr. This etch gas allows an RIE process which combines the very desirable features of selectivity (high polycrystalline silicon/-monocrystalline silicon etch rate ratio) and directionality which creates substantially vertical sidewalls on the etched features.

8 Claims, 1 Sheet Drawing,

16 Pages Specification

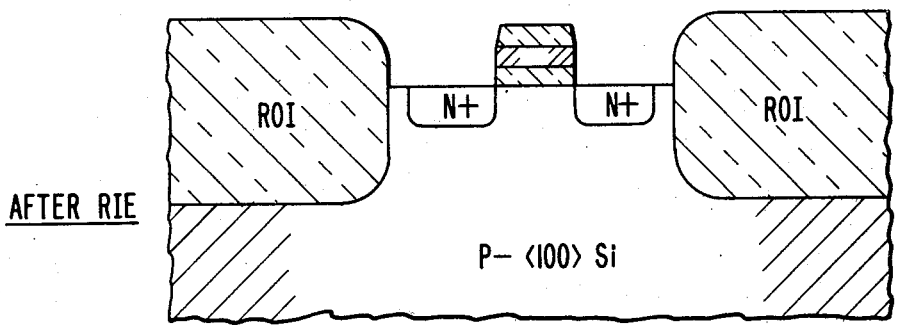

The file of this unexamined application may be inspected and copies thereof may be purchased (849 O.G. 1221, Apr. 9, 1968).